United States Patent [19]

Covino

[11] Patent Number: 5,650,733
[45] Date of Patent: Jul. 22, 1997

[54] DYNAMIC CMOS CIRCUITS WITH NOISE IMMUNITY

[75] Inventor: James J. Covino, Essex, Vt.

[73] Assignee: International Business Machines Corporation, Armonk, N.Y.

[21] Appl. No.: 547,269

[22] Filed: Oct. 24, 1995

[51] Int. Cl.⁶ .................................................. H03K 19/003
[52] U.S. Cl. ........................................... 326/24; 326/113
[58] Field of Search ............................ 326/23, 24, 25, 326/121, 95, 98, 113, 114

[56] References Cited

U.S. PATENT DOCUMENTS

| | | | |
|---|---|---|---|
| 3,322,974 | 5/1967 | Ahrons et al. | |
| 3,526,783 | 9/1970 | Booher | |
| 3,683,203 | 8/1972 | Smith | 377/79 |
| 4,570,084 | 2/1986 | Griffin et al. | 326/98 |
| 4,595,845 | 6/1986 | Briggs | 326/121 |
| 4,692,634 | 9/1987 | Fang et al. | 327/408 |
| 4,709,173 | 11/1987 | Nishimichi et al. | 327/408 |
| 4,797,580 | 1/1989 | Sunter | 326/121 |
| 5,073,726 | 12/1991 | Kato et al. | 326/24 |
| 5,220,221 | 6/1993 | Casper | 327/51 |
| 5,272,397 | 12/1993 | Chen et al. | 326/97 |
| 5,280,203 | 1/1994 | Hung et al. | 326/37 |
| 5,397,937 | 3/1995 | Ueda et al. | 326/113 |
| 5,483,181 | 1/1996 | D'Souza | 326/121 |
| 5,488,319 | 1/1996 | Lo | 326/98 |

OTHER PUBLICATIONS

Chen, John Y.; "CMOS Devices and Technology for VLSI"; copyright 1990 by Prentice-Hall, Inc.; pp. 94–97.

*Primary Examiner*—Edward P. Westin
*Assistant Examiner*—Benjamin D. Driscoll
*Attorney, Agent, or Firm*—Whitham, Curtis, Whitham & McGinn; Howard J. Walter, Esq.

[57] ABSTRACT

Dynamic CMOS circuits are provided with improved noise immunity. These circuits comprise first and second stacked NFET devices connected respectively between ground and a first node. An input node is coupled to the first NFET device closest to ground and a clock node coupled to the second NFET device closest to the first node. A PFET device is connected between the input node and a node formed by the stacked NFET devices. The first NFET device and the PFET device form an inverter for receiving an input signal, the switch point of the inverter being adjustable by adjusting the PFET/NFET ratio of the inverter, thereby increasing the noise immunity of the circuit.

6 Claims, 2 Drawing Sheets

DYNAMIC CMOS CIRCUITS WITH NOISE IMMUNITY

BACKGROUND OF THE INVENTION

1. Field of the Invention

The present invention generally relates to dynamic complementary metal-oxide semiconductor (CMOS) circuits and, more particularly, to high speed CMOS circuits with improved noise immunity.

2. Description of the Related Art

In many high speed clocked dynamic CMOS circuit applications, a receiver circuit in the form of a stack of field effect transistor (FET) devices are driven by a clock signal and an input data signal. Often the input data signal is driven directly into a NFET (n-type FET) device; however, such a receiver circuit lacks noise immunity, the noise margin being controlled by the size of the NFET device. A costly fix to this problem is to buffer the input data signal with static inverters.

SUMMARY OF THE INVENTION

It is therefore an object of the present invention to provide dynamic clocked CMOS circuits with improved noise immunity.

According to the present invention, the receiver circuit is modified such that data input is through the device most directly connected to ground and the clock input device is stacked above the data input device. Further, a PFET (p-type FET) device is connected between the input and the node formed by the stacked clock and input devices. The PFET device and the NFET device receive the input from an inverter. The signal input trip point is set by adjusting the PFET/NFET ratio of the inverter, rather than the conventional NFET threshold voltage, $V_t$. The preferred PFET/NFET ratio is approximately one-eighth to one-quarter.

To achieve these and other advantages and in accordance with the purpose of the invention, as embodied and broadly described, the invention provides for a CMOS receiver circuit with improved noise immunity, comprising first and second stacked NFET devices connected respectively between ground and a first node, an input node coupled to the first NFET device closest to ground and a clock node coupled to the second NFET device closest to said first node, a PFET device connected between the input node and a node formed by the stacked NFET devices, the first NFET device and the PFET device forming an inverter for receiving an input signal, the switch point of the inverter being adjustable by adjusting the PFET/NFET ratio of the inverter, thereby increasing the noise immunity of the circuit.

The above circuit arrangement may be used in a variety of applications including, but not limited to, CMOS receivers, dynamic AND/NAND gates, dynamic multiplexing circuits and dynamic differential input circuits. It is to be understood that both the foregoing general description and the following detailed description are exemplary and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
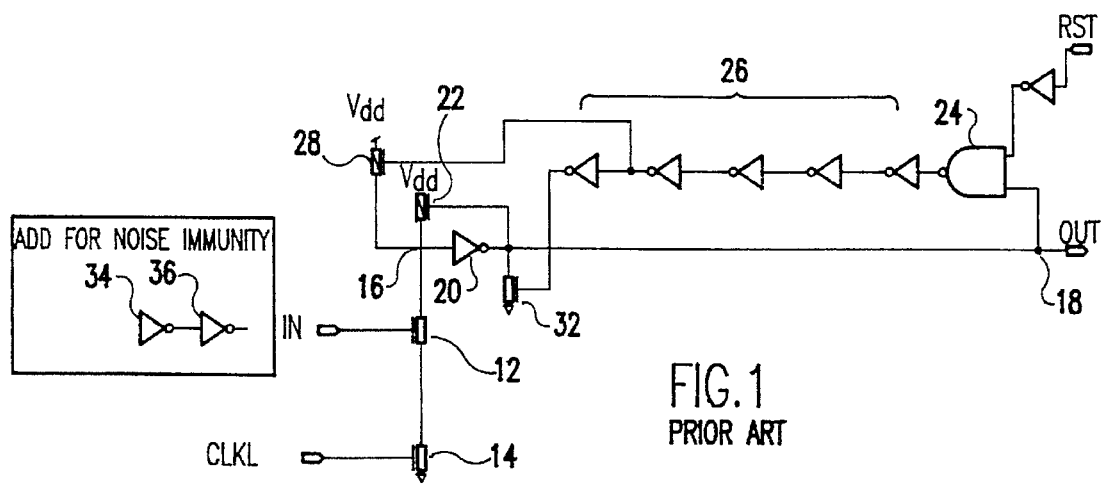
FIG. 1 is a schematic diagram of a dynamic AND circuit incorporating a conventional CMOS receiver circuit.

Referring to the drawings, and more specifically to FIG. 1, a dynamic AND circuit incorporating a conventional high speed receiver circuit is first described to illustrate the problem solved by the invention. The AND circuit receives a clock signal (CLKL), an input data signal (IN), and an externally initiated restore (RST) signal. It is understood that if the RST node is grounded, the circuit would become a self-restore circuit. The clock signal is typically internally generated and quiet, whereas the input data signal is generated off-chip and noisy.

In this circuit, a first NFET device 12 is used to receive the input data signal (IN) to the circuit. The clock signal (CLKL) is input to a second NFET device 14 stacked between NFET device 12 and ground. In the general operation of the circuit, at time $t_o$ node 16 is precharged high, and the output node 18 is precharged low via inverter 20. PFET device 22 is driven by inverter 20 to maintain this precharged state.

An input data signal (IN) on the gate of NFET device 12 biases that device into conduction, and when the clock signal (CLKL) is pulsed at the gate of NFET device 14, the node 16 is discharged, driving output node 18 high through inverter 20. In the restore operation, after the clock signal (CLKL) has pulsed, the restore signal (RST) goes low, driving node 16 back high via the NAND gate 24, inverter chain 26 and PFET device 28, and the output node 18 low via the same NAND gate 24 and inverter chain 26 and NFET device 32. With the output node 18 low, the output of NAND gate 24 goes high, turning off PFET device 28 and NFET device 32. The circuit is then restored to its precharge level.

Returning to the receiving circuit comprising NFET devices 12 and 14, a chronic problem for these conventional receiver input circuits is they lack sufficient noise immunity because the input signal is driven directly into a NFET device. The voltage threshold, $V_t$, typically 0.4 volts, is the switch point of the NFET device. Also, the NFET device itself accounts for a certain amount of noise in the source to ground path. In FIG. 1 the noise margin is controlled by the PFET device 22.

In an effort to reduce input noise and buffer the input signal, some have used static input inverters, such as inverters 34 and 36 shown in FIG. 1. While this increases the noise immunity of the circuit, it slows down the circuit significantly. NOR type inputs have also been used to reduce noise in DRAM (dynamic random access memory) devices, but they also slow the circuit down.

In light of the foregoing, there exists a need for a CMOS receiver circuit with improved noise immunity in high speed circuits. The solution to the noise immunity problem should not significantly slow down the circuit.

Figure 2:
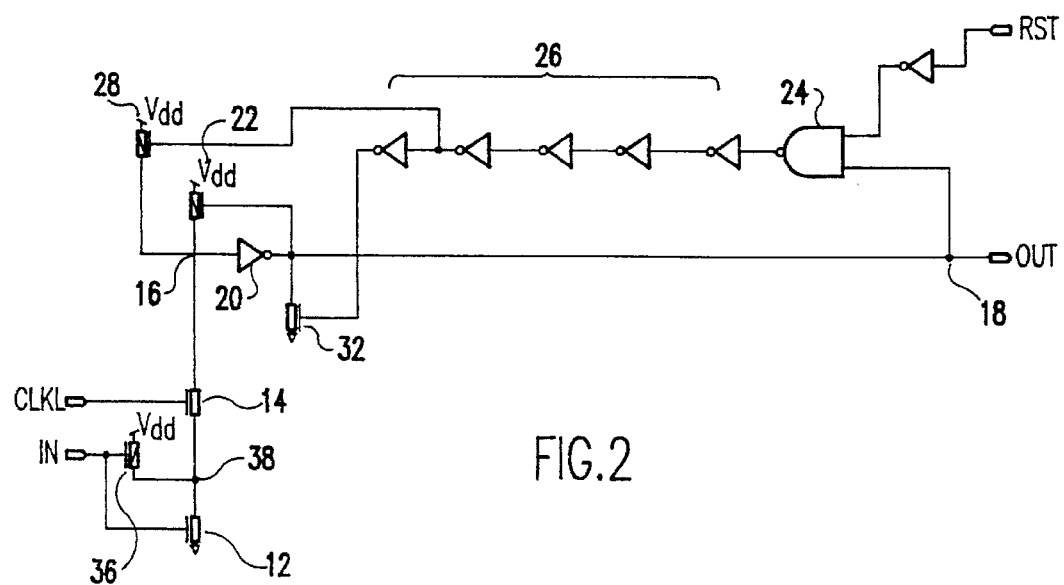
FIG. 2 is a schematic diagram of the dynamic AND circuit with the improved CMOS receiver circuit in accordance with the present invention.

FIG. 2 shows the circuit of FIG. 1 modified according to the present invention. In FIG. 2, the CMOS receiver circuit is modified by inverting the stacked NFET devices 12 and 14. This places the clock signal (the quiet signal) NFET device 14 at the top of the stack, and the input signal (the noisy signal) NFET device 12 closest to ground. In addition, a PFET device 36 is added between the source voltage, $V_{dd}$, and the node 38 between the NFET devices 12 and 14. The input signal (IN) is connected to the gate of PFET device 36. Thus, the input signal sees an inverter comprising PFET device 36 and NFET device 12. The threshold voltage, $V_t$, seen by the input data signal (IN) can be adjusted based on the device strength ratios of PFET 36 and NFET 12. Device strength as used herein is defined as the amount of current a device is capable of conducting. The inverter's switch point can be adjusted by altering the size ratios of PFET 36 and NFET 12, thereby improving the noise immunity of the circuit.

The choice of a particular PFET/NFET device strength ratio involves a balancing of the performance (i.e., speed) of the circuit and noise margin. Specifically, increasing the size of PFET 36 will improve the noise margin but it will hamper the performance of the dynamic AND circuit. Good noise immunity and adequate performance may generally be realized when the device strength of the PFET device 36 is about one-eighth to one-quarter the strength of NFET device 34.

The receiver circuit according to the invention is not limited to the dynamic AND circuit of FIG. 2 and can be used in any application in which high speed (AND/NAND) circuits are needed and one of the input signals requires additional noise immunity.

Figure 3:
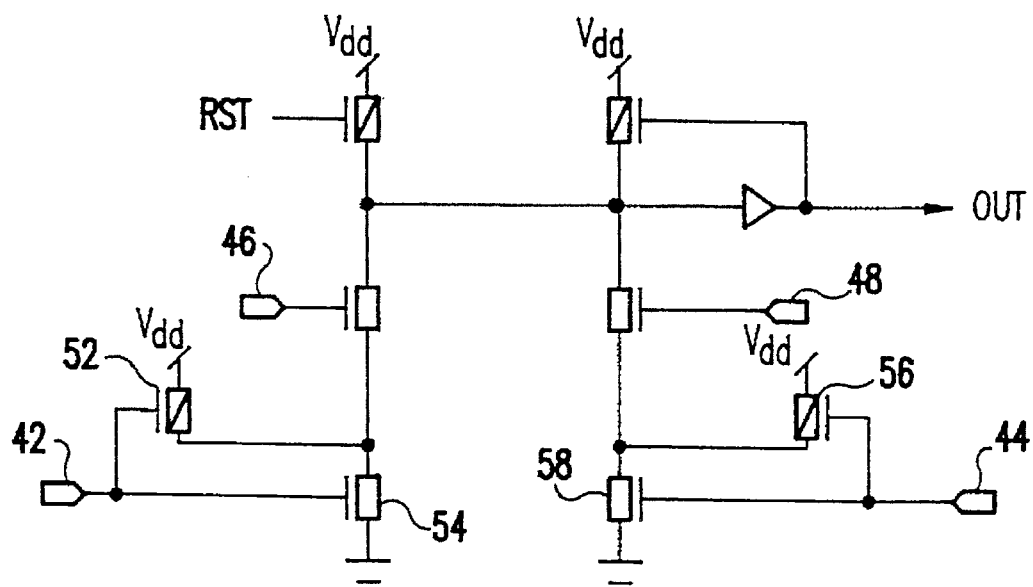
FIG. 3 is a schematic diagram of the receiver circuit according to the invention employed in a dynamic multiplexing circuit.

FIG. 3 depicts a dynamic multiplexing circuit utilizing the principles of the present invention. In FIG. 3 the noisy data inputs would be connected to input nodes 42 and 44. The control inputs that arrive early and can be locally buffered are connected to input nodes 46 and 48. The input signal at node 42 sees an inverter comprised of transistors 52 and 54, while the input signal at node 44 sees an inverter comprised of transistors 56 and 58. The inverter PFET/NFET device strength ratios for the present multiplexing embodiment would be the same as the embodiment of FIG. 2.

Figure 4:
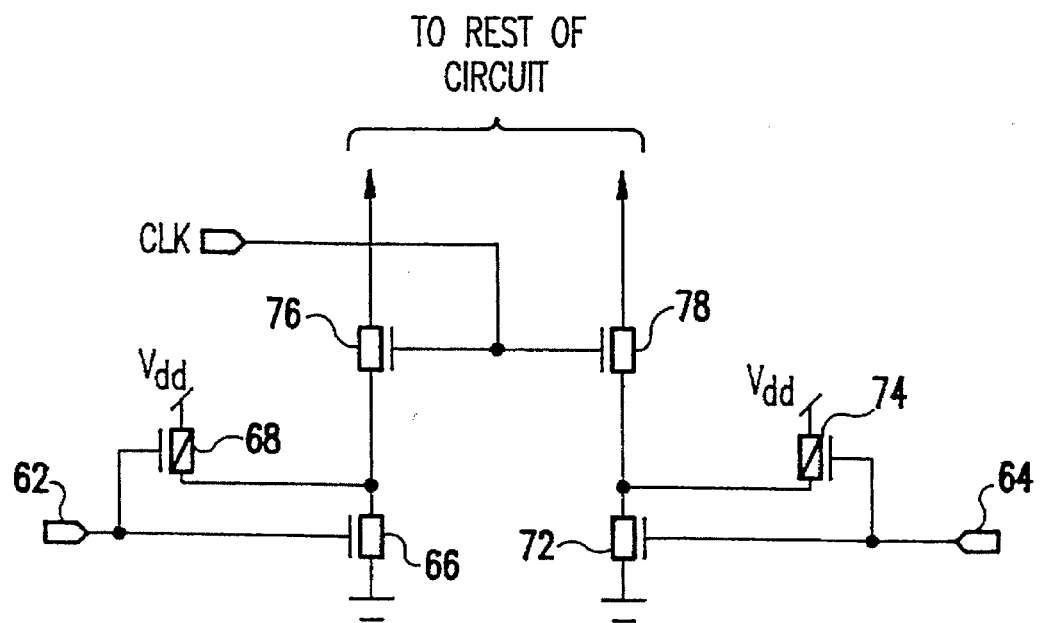
FIG. 4 is a schematic diagram of the receiver circuit according to the invention employed in a differential input application.

FIG. 4 depicts a differential input application of the invention. Here the noisy data inputs are connected to nodes 62 and 64. These noisy inputs are respectively connected to the inverter composed of NFET device 66 and PFET device 68 and the inverter composed of NFET device 72 and PFET device 74. The second input signal, clock or control signal CLK, is applied to NFET devices 76 and 78 at the top input in the two stacks.

While the invention has been described in terms of the embodiments described above, those skilled in the art will recognize that the invention can be practiced with modification within the spirit and scope of the appended claims.

Having thus described my invention, what I claim as new and desire to secure by Letters Patent is as follows:

1. A high speed CMOS receiver circuit comprising:
   first and second stacked NFET devices connected between a first node and ground, the second NFET device being closest to ground;
   a data input connected to the second NFET device, said data input being noisy;
   a clock input connected to the first NFET device, said clock input being relatively quiet;
   a PFET device connected between a source voltage and a node formed by the first and second NFET devices, a gate of the PFET device being connected to said data input so that the PFET device and the second NFET device form an inverter, the PFET/NFET ratio being adjusted to set an input signal trip point, thereby improving noise immunity of the receiver;
   an output node coupled to said first node by another inverter; and
   restore means for precharging said first node high and said output node low, simultaneous occurrence of said first and second inputs discharging said first node and driving said output node high via said other inverter and said restore means thereafter again precharging first node high and said output node low.

2. The CMOS receiver recited in claim 1 wherein the PFET/NFET ratio is approximately one-eighth to one-quarter.

3. A dynamic AND circuit comprising:
   first and second stacked NFET devices connected between a first node and ground, the second NFET device being closest to ground;
   a first input connected to the first NFET device, said first input being relatively quiet;
   a second input connected to the second NFET device, said second input being noisy;
   a PFET device connected between a source voltage and a node formed by the first and second NFET devices, a gate of the PFET device being connected to said second input so that the PFET device and the second NFET device form an inverter, the PFET/NFET ratio being adjusted to set an input signal trip point, thereby improving noise immunity of the receiver;
   an output node coupled to said first node by another inverter; and
   restore means for precharging said first node high and said output node low, simultaneous occurrence of said first and second inputs discharging said first node and driving said output node high via said other inverter and said restore means thereafter again precharging first node high and said output node low.

4. The dynamic AND circuit recited in claim 3 wherein the PFET/NFET ratio is approximately one-eighth to one-quarter.

5. A dynamic CMOS multiplexer circuit comprising:
   first and second stacked NFET devices connected between a first node and ground, the second NFET device being closest to ground;
   a first control input connected to the first NFET device, said first control input being relatively quiet;
   a first data input connected to the second NFET device, said first data input being noisy;
   a first PFET device connected between a source voltage and a node formed by the first and second NFET devices, a gate of the first PFET being connected to the first data input so that the first PFET device and the second NFET device form a first inverter, the PFET/NFET ratio of the first inverter being adjusted to set an input signal trip point, thereby improving noise immunity of the first data input of the dynamic multiplexer;
   third and fourth stacked NFET devices connected between said first node and ground, the fourth NFET device being closest to ground, said first node being connected to an output by a second inverter;
   a second control input connected to the third NFET device, said second control input being relatively quiet;
   a second data input connected to the fourth NFET device, said second input being noisy;
   a second PFET device connected between a source voltage and a node formed by the third and fourth NFET devices, a gate of the second PFET being connected to the second data input so that the second PFET device and the fourth NFET device form a third inverter, the PFET/NFET ratio of the third inverter being adjusted to set an input signal trip point, thereby improving noise immunity of the second data input of the dynamic multiplexer; and restore means for precharging said first node high and said output node low, simultaneous occurrence of said first and second inputs or said third and fourth inputs discharging said first node and driving said output node high via said second inverter and said restore means thereafter again precharging first node high and said output node low.

6. The dynamic CMOS multiplexer circuit of claim 5 wherein the PFET/NFET ratios of the first and second inverters are approximately one-eighth to one-quarter.

* * * * *